(12) United States Patent
Wu

(10) Patent No.: US 8,514,560 B2
(45) Date of Patent: Aug. 20, 2013

(54) ROTATE-TO-RETRACT TYPE STORING APPARATUS

(75) Inventor: Chia Chin Wu, Taichung (TW)

(73) Assignee: Dong Wei Industry Limited Company, Taichung (TW)

( * ) Notice: Subject to any disclaimer, the term of this patent is extended or adjusted under 35 U.S.C. 154(b) by 413 days.

(21) Appl. No.: 12/977,023

(22) Filed: Dec. 22, 2010

(65) Prior Publication Data

US 2011/0228465 A1 Sep. 22, 2011

(30) Foreign Application Priority Data

Mar. 17, 2010 (TW) ................................ 99204653 U

(51) Int. Cl.
*G06F 1/16* (2006.01)
(52) U.S. Cl.
USPC .................. 361/679.31; 439/131; D14/480.6; D14/480.7
(58) Field of Classification Search
USPC ....................... 361/679.31; D14/480.6, 480.7
See application file for complete search history.

(56) References Cited

U.S. PATENT DOCUMENTS

| | | | |
|---|---|---|---|
| 7,009,847 B1 * | 3/2006 | Wu et al. ........................ 361/737 |
| 7,295,431 B2 * | 11/2007 | Chuang .................... 361/679.55 |
| 7,466,556 B2 * | 12/2008 | Hiew et al. ..................... 361/737 |
| 7,672,122 B2 * | 3/2010 | Lin et al. ................... 361/679.31 |
| 7,883,353 B2 * | 2/2011 | Hao et al. ........................ 439/358 |
| 8,125,774 B2 * | 2/2012 | Kelley et al. .............. 361/679.31 |
| 8,246,362 B2 * | 8/2012 | Ma .................................. 439/131 |
| 8,388,361 B2 * | 3/2013 | Wavra et al. ................... 439/131 |
| 2005/0079738 A1 * | 4/2005 | Ahn .................................. 439/1 |
| 2007/0171620 A1 * | 7/2007 | Lee ................................. 361/737 |
| 2008/0019090 A1 * | 1/2008 | Zhu et al. ........................ 361/684 |
| 2008/0232060 A1 * | 9/2008 | Yu et al. .......................... 361/684 |
| 2008/0276099 A1 * | 11/2008 | Nguyen et al. ................. 713/186 |
| 2008/0278902 A1 * | 11/2008 | Nguyen et al. ................ 361/684 |
| 2010/0075517 A1 * | 3/2010 | Ni et al. .......................... 439/131 |
| 2010/0265649 A1 * | 10/2010 | Singh et al. ............... 361/679.32 |
| 2010/0328874 A1 * | 12/2010 | Ko ............................. 361/679.32 |

* cited by examiner

*Primary Examiner* — Lisa Lea Edmonds
(74) *Attorney, Agent, or Firm* — Raymond Y. Chan; David and Raymond Patent Firm

(57) ABSTRACT

A rotate-to-retract type storing apparatus including a U-shaped protective casing, a shell body and a storing arrangement. A disk member is protrudes adjacent to an open side at the surface of protecting casing, and a protrusion member is provided at a partial position of the disk member. The shell body defines a receiving cavity and includes an insertion hole at a front end thereof for a second end portion of the storing arrangement to get into the receiving cavity and a retention hole penetrating a bottom surface of the shell body for coupling with the disk member so that the shell body is capable of rotating with respect to the protective casing and directing the coupling slot to rotate with respect to the protrusion member. This defines a moving distance—just enough for a first end portion of the storing arrangement to move between an application position and a retraction position. The result is a minimized size of the storing apparatus.

8 Claims, 5 Drawing Sheets

ROTATE-TO-RETRACT TYPE STORING APPARATUS

CROSS REFERENCE OF RELATED APPLICATION

This is a non-provisional application that claims priority under 35 U.S.C. §119 to a non-provisional application, application number TW099204653, filed on Mar. 17, 2010.

BACKGROUND OF THE PRESENT INVENTION

1. Field of Invention

The present invention relates to a storing apparatus, more particularly to a USB digital storing apparatus, wherein an inserting end thereof is adapted for rotation between an application position and a retracting position.

2. Description of Related Arts

Portable USB flash drive storing apparatuses are gaining momentum in the marketplace and gradually taking place of optical disks.

A conventional USB flash drive usually comprises two members—a storing arrangement and a protective casing, wherein the storing arrangement is movable with respect to the protective casing in a tongue-groove coupling so the USB flash drive is fixed while being transported. However, the two-member design easily results in a loss of the protective casing when it is taken away from the storing arrangement; therefore, a rotatory USB flash drive having a single-member design has appeared in the USB market.

Accordingly, a typical rotatory flash drive has a structure disclosed in the patent publication of TW-M373624 (hereinafter cited as 624 patent) and TW-M372994 (hereinafter cited as 994 patent), wherein according to the 624 patent, the flash drive comprises a storing arrangement and a U-shaped shading casing, wherein the storing arrangement is adapted for orientations at 90°, 180°, 270°, 360° with respect to the U-shaped shading casing. According to the 994 patent, the flash drive comprises a main body having a position slot which acts as an axis for the rotating of a protective casing, and the protective casing comprises a protrusion member and a position member to couple with the main body at an open end thereof so that the protective casing is capable of rotating with respect to the main body between an application position and a retracting position.

Both the flash drive of the 624 patent and 994 patent can avoid the loss of the protective casing by means of a design in which the main body and the protective casing are adapted to rotate with respect to each, However, no matter which part acts as the axis of rotation, the main body or the protective casing, there are still disadvantages.

According to the 624 patent, the position of the axis should be adjacent to the open end of the protective casing (i.e. not being positioned at the center of the protective casing) so that the main body can be successfully rotated outside for application; therefore, the main body does can be retracted to be completely received in the protective casing, but when the main body is rotated outside, the total length of the flash drive will be doubled as compared with when the main body is received in the protective casing.

According to the 994 patent, when the main body is rotated outside for application, the total length of the flash drive is relatively shorter (than that of the 624 patent), wherein a main body portion contributed for the corresponding reduced length is rotated so as to be extended along the longitudinal length of the protective casing But when the main body is received in the protective casing, a large gap is defined between the inserting end of the main body and the closing end of the protective casing, and therefore the other end—which is opposite to the inserting end of the main body—is exposed outside. This has the, perhaps, uninted effect of adding to the length of the flash drive. Therefore, the above mentioned construction of the flash drive departs from the need of customers for a relatively lighter, thinner, shorter and smaller flash drive, and thus improvement should be made.

SUMMARY OF THE PRESENT INVENTION

The invention is advantageous in that it provides a rotate-to-retract type storing apparatus comprising a storing arrangement, a shell body and a protective casing, wherein when the shell body rotates with respect to the protective casing, the storing arrangement simultaneously rotates to a position outside or inside the protecting casing. This minimizes the occupation size of the storing apparatus when the storing apparatus—both at the application position and retracting position.

Additional advantages and features of the invention will become apparent from the description which follows, and may be realized by means of the instrumentalities and combinations particular point out in the appended claims.

According to the present invention, the foregoing and other objects and advantages are attained by a rotate-to-retract type storing apparatus adapted for rotation between an application position and a retracting position. It comprises: a protective casing, the protective casing comprises an upper arm, a lower arm and a closing end to define a U-shaped space having an open side, a disk member protrudes adjacent to the open side at the surface of the lower arm of the protective casing, a protrusion member adjacent to the open side at a partial position of the disk member; a shell body defining a receiving cavity, the shell body including an insertion hole provided at a front end thereof to communicate with the receiving cavity and a retention hole penetrating a bottom surface of the shell body for coupling with the disk member so that the shell body is capable of rotating with respect to the protective casing; and a storing arrangement comprising a first end portion and a second end portion, wherein an electronic terminal is provided at a top surface of the first end portion A coupling slot is transversely extended at a bottom surface of the second end portion, wherein the second end portion of the storing arrangement has access to the receiving cavity by passing through the insertion hole, and the coupling slot of the second end portion is coupled with the protrusion member so that the second end portion thereof is secured in the receiving cavity, wherein when the shell body is rotated with respect to the protective casing to be at the retracting position. The partial protrusion member can move straightly in the coupling slot to direct the first end portion of the storing arrangement to retract into the receiving cavity. When the shell body is rotated with respect to the protective casing to be at the application position, the partial protrusion member moves straightly in the coupling slot, to direct the first end portion of the storing arrangement to get out of the receiving cavity.

Still further objects and advantages will become apparent from a consideration of the ensuing description and drawings.

These and other objectives, features, and advantages of the present invention will become apparent from the following detailed description, the accompanying drawings, and the appended claims.

BRIEF DESCRIPTION OF THE DRAWINGS

FIG. 1A is a schematic view of a construction of shell body of the storing apparatus on the opposite side according to the above preferred embodiment of the present invention.

DETAILED DESCRIPTION OF THE PREFERRED EMBODIMENT

Figure 1:
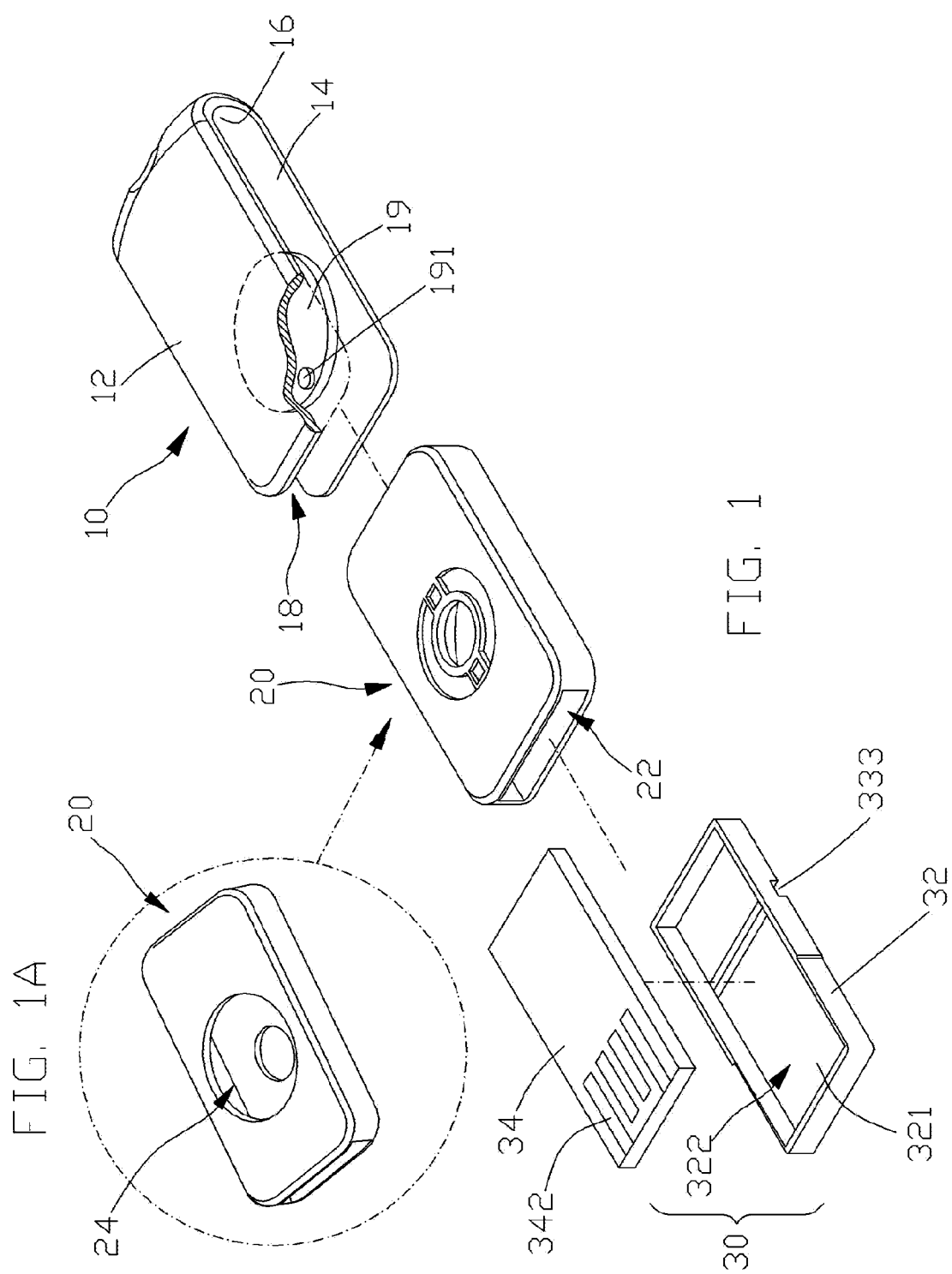
FIG. 1 is an exploded perspective view of a storing apparatus according to a preferred embodiment of the present invention.
Figure 2:
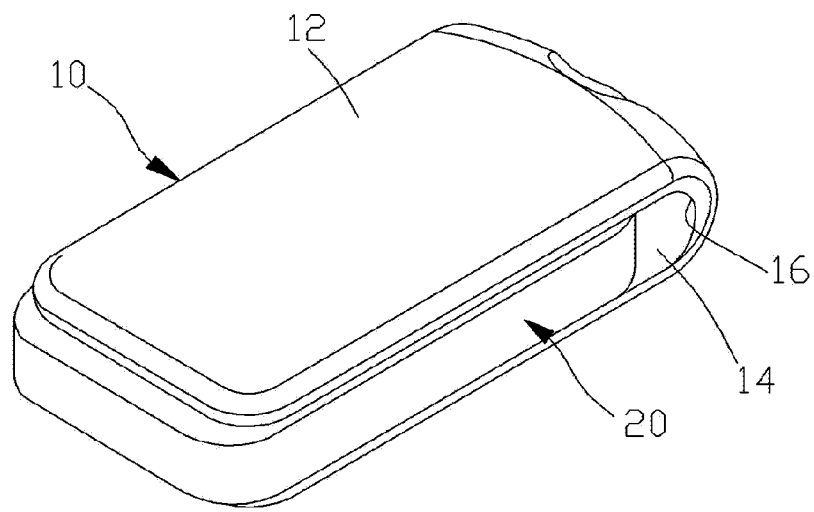
FIG. 2 is perspective view of the storing apparatus according to the above preferred embodiment of the present invention.
Figure 3:
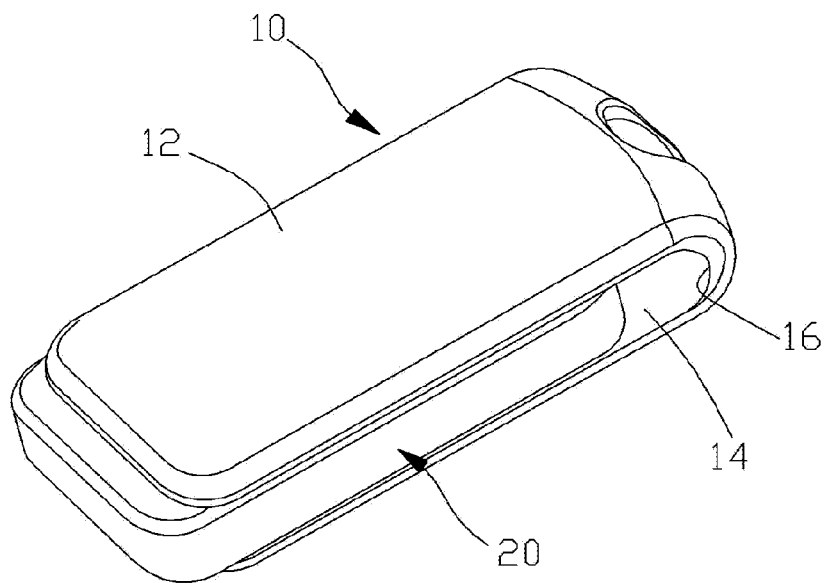
FIG. 3 is a schematic view of the storing apparatus according to the above preferred embodiment of the present invention, illustrating the storing arrangement and the protective casing at the retracting position.

Referring to FIG. 1 to FIG. 3 of the drawings, a rotate-to-retract type storing apparatus according to a preferred embodiment of the present invention is illustrated, wherein the storing apparatus comprises a protective casing 10, a shell body 20 and a storing arrangement 30.

The protective casing 10 comprises an upper arm 12, a lower arm 14 and a closing end 16 connecting the upper arm 12 and the lower arm 14 to define a U-shaped space 18 having an open side, a disk member 19 protruding adjacent to the open side at the surface of the lower arm 14 of the protecting casing 10, the cross section of the disk member 19 is preferably round-shaped. A protrusion member 191 is adjacent to the open side at a partial position of the disk member 19.

The shell body 20 is constructed to define a receiving cavity (referring to FIG. 1A), the shell body 20 comprises an insertion hole 22 at a front end thereof to communicate with the receiving cavity and a retention hole 24 (the radius of the retention hole 24 is equal to or slightly larger than the radius of the disk member 19) penetrating a bottom surface of the shell body 20 for coupling with the disk member 19 so that the shell body is capable of rotation with respect to the protective casing—in both clockwise or counterclockwise directions. In addition, the thickness of the disk member 19 is about the same with the thickness of the wall of the retention hole.

The storing arrangement 30 comprises a supporting member 32 and a main body 34, wherein the cross section of the supporting member 32 is substantially U-shaped so that a base board 321 of the supporting member 32 is constructed to define a supporting cavity 322 having an open top side, wherein a coupling slot 333 is transversely extended at a distal end thereof at a partial position away from the center of the base board 321. The main body 34 is provided in the supporting cavity 322, and another end portion—opposite to the direction of the coupling slot 333—is provided with an electronic terminal 342 for electronically connecting to a USB connecting terminal. A portion of the storing arrangement 30 with the electronic terminal 342 is defined as a first end portion, while another portion corresponding to the coupling slot 333 is defined as a second end portion; wherein the second end portion of the storing arrangement 30 has access to the receiving cavity by passing through the insertion hole 22 And the coupling slot 333 of the second end portion is coupled to protrusion member 191 so that the second end portion thereof is secured in the receiving cavity.

Referring to FIG. 4 to FIG. 8 of the drawings, wherein the operation of the rotate-to-retract type storing apparatus according to the above preferred embodiment of the present invention is described.

Figure 6:
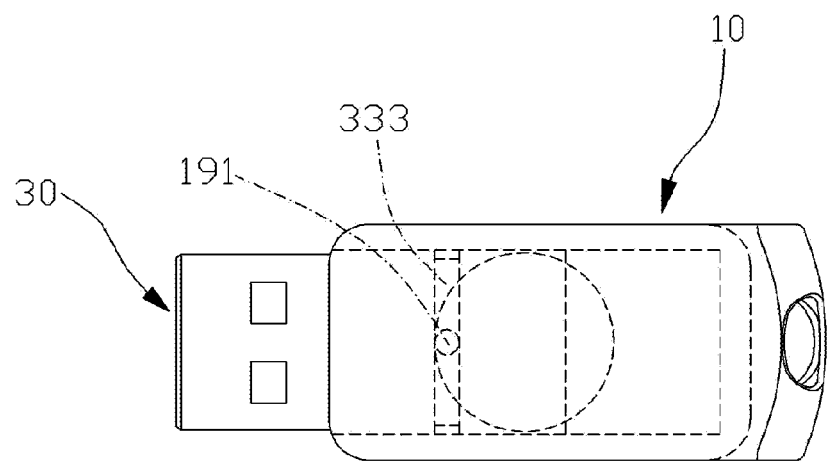
FIG. 6 is a perspective view of the storing apparatus in FIG. 5.
Figure 7:
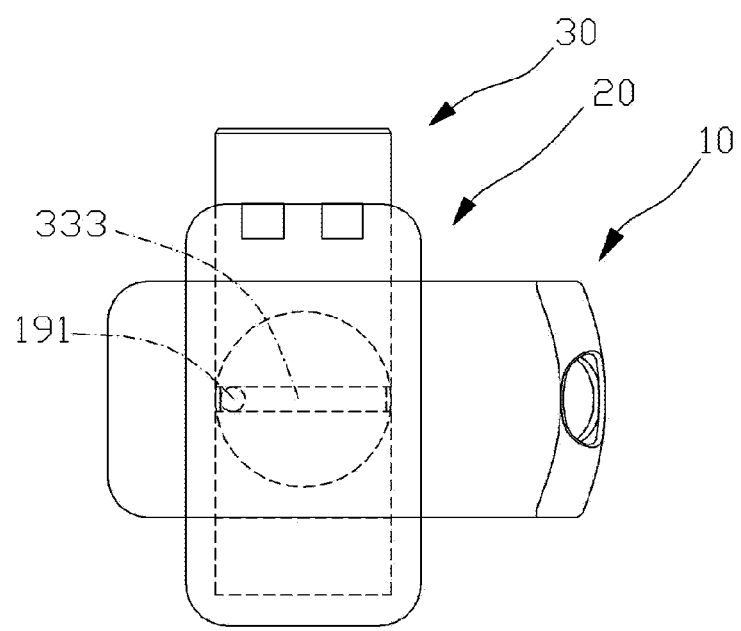
FIG. 7 is a schematic view of the storing apparatus according to the above preferred embodiment of the present invention, illustrating the storing arrangement rotating from the application position to the retracting position.
Figure 8:
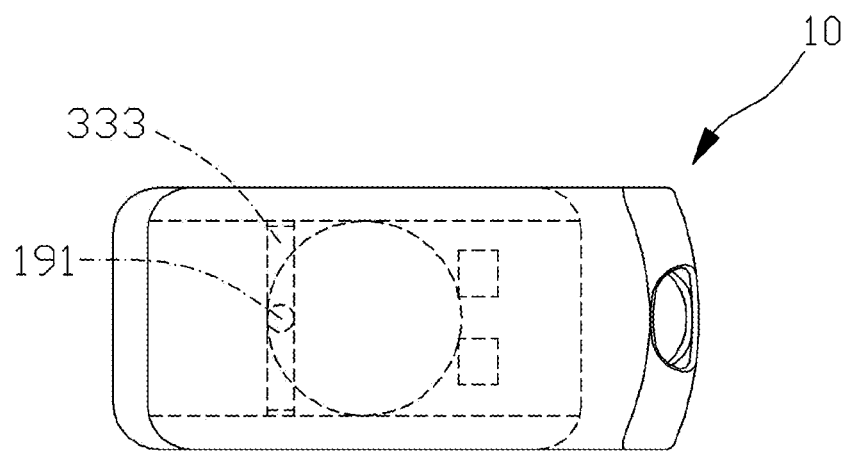
FIG. 8 is a perspective view of the storing apparatus according to the above preferred embodiment of the present invention, wherein the storing apparatus is at the retracting position.

As shown in FIG. 6, when the storing apparatus is at the application position, the partial protrusion member 191 is just positioned at the center of the coupling slot 333 which defines a center line thereof, the first end portion of the storing apparatus 30, and is rotated out of the receiving cavity of the shell body 20. In order to retract the storing apparatus into the U-shaped space 18 of the protective casing 10 so that the protective casing 10 overlaps the storing arrangement 30 (as shown in FIG. 8), gently pushing the shell body 20 (as shown in FIG. 7) until the shell body 20 is rotated 90° in clockwise direction with respect to the connecting joint between the retention hole 24 and the disk member 19, the coupling slot 333 of the storing arrangement 30 is correspondingly rotates with respect to the protrusion member 191 so that the coupling slot 333 is moved to be extended vertical to the center line and the exposed first end portion of the storing arrangement 30 is simultaneously guided to the receiving cavity of the shell body 20. When the storing arrangement 30 is further rotated with an angle of 90° in clockwise direction, the coupling slot 333 of the storing arrangement 30 is continually rotating with respect to the protrusion member 191 so that the coupling slot 333 is moved back so as to be extended along the center line so that the storing arrangement 30 is guided to be retracted into the receiving cavity of the shell body 20. Therefore, the storing arrangement 30 and the shell body 20 are completely received in the U-shaped space 18 of the protective casing 10.

Figure 4:
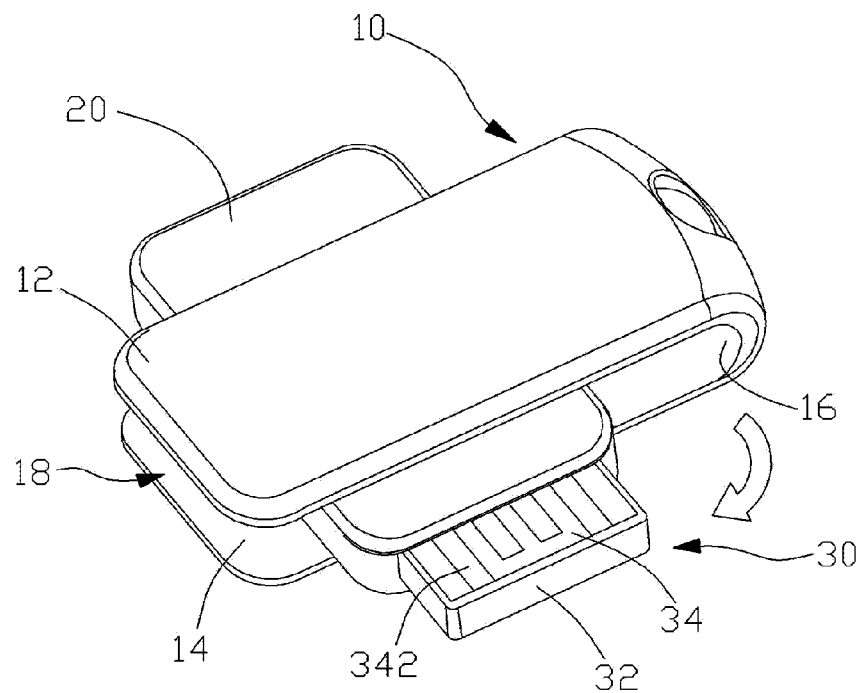
FIG. 4 is a schematic view of the storing apparatus according to the above preferred embodiment of the present invention, illustrating the storing arrangement rotating from the retracting position to the application position.
Figure 5:
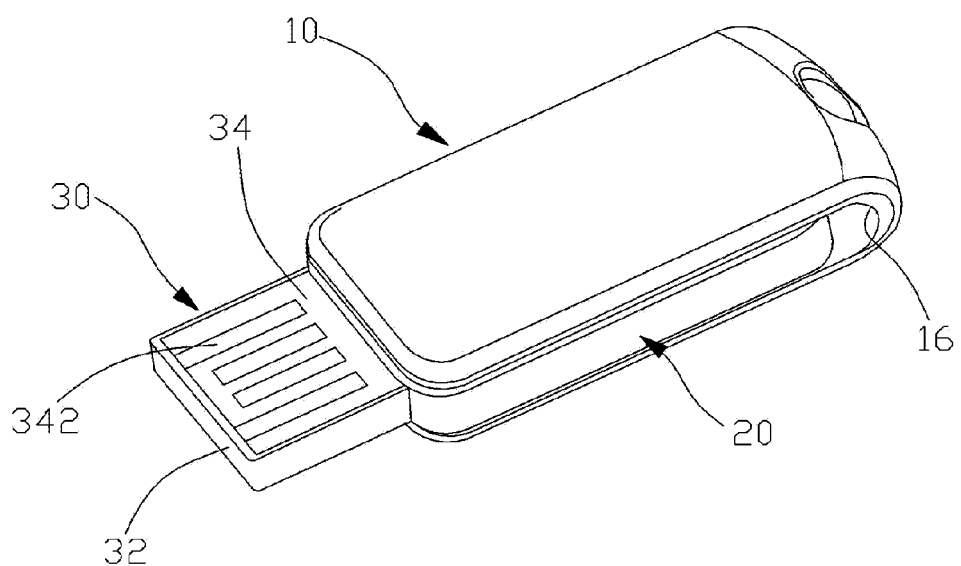
FIG. 5 is a schematic view of the storing apparatus according to the above preferred embodiment of the present invention, illustrating the storing apparatus at the application position.

Accordingly, as shown in FIG. 4 and FIG. 5, when the storing arrangement 30 at the retracting position shown in FIG. 8, is required to be extended in a straight line with the protective casing 10 so that the storing apparatus is at the application position ready for use (as shown in FIG. 5 and FIG. 6), pushing the shell body 20 in the same manner as mentioned above to direct the shell body 20 to move clockwise at an angle of 90°. The coupling slot 333 is moved to be extended vertical to the center line, meanwhile, the first end portion of the storing arrangement 30 is forced out of the receiving cavity. When the shell body 20 is further rotated clockwise with an additional angle of 90° and the coupling slot 333 is returned to be extended along the center line, the first end portion of the storing arrangement 30 is completely being out of the receiving cavity. Thus, the electronic terminal 342 thereof is capable of coupling with a USB connecting terminal of a computer (not shown) so as to have access or store digital information.

According to the storing apparatus of the present invention, the disk member 19 of the protective casing 10 is adapted to rotate with respect to the retention hole 24 of the shell body 20. The straight line shaped coupling slot, which is partially positioned at the bottom side of the shell body 20, is coupled with the protrusion member 191 which is partially positioned at the surface of the disk member 19. Therefore, the shell body 20 is adapted to rotate with respect to the protective casing 10 and direct the coupling slot 333 to rotate with respect to the protrusion member 191. Thus, simply by changing the relative position of the coupling slot 333 to the protrusion member 191, the storing arrangement 30 is adapted to move between the application position and the retracting position. At the application position the storing arrangement 30 gets out of the receiving cavity of the shell body. At the retracting position, the storing arrangement 30 is retracted to be received in the receiving cavity.

When the first end portion of the storing arrangement 30 is completely received in the shell body 20, the shell body 20 is completely overlapped with the protective casing 10 so that a minimized size (length) is attained. In contrast to the storing apparatus of 994 patent, the body portion of the storing arrangement 30 is not exposed outside of the protective casing 10—so that a desired relative shorter length of the storing apparatus at the retracting position is attained.

Furthermore, when the storing arrangement 30 rotates out of the receiving cavity to be at the application position, only the first end portion thereof is exposed outside of the protective casing. Thus, the length of the exposing portion of the storing apparatus of the present invention is just half that of the storing apparatus of 624 patent—so that a disadvantage of minimizing the total length of the storing apparatus at the application position is attained.

Accordingly, the shell body 20 is adapted to rotate with respect to the protective casing 10 so as to direct the coupling slot 333 to rotate with respect to the protrusion member 191, enabling the storing apparatus to minimize its total length both at the application position and the retracting position. Therefore, the storing apparatus of the present invention has overcome the disadvantages of the prior art.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A rotate-to-retract type storing apparatus adapted for rotation between an application position and a retraction position, comprising:
   a protective casing including an upper arm, a lower arm and a closing end for defining a U-shaped space having an open side, a disk member protrudely adjacent to said open side at a surface of said lower arm of said protecting casing, and a protrusion member at a partial position of said disk member;
   a shell body defining a receiving cavity, said shell body having an insertion hole provided at a front end thereof to communicate with said receiving cavity and a retention hole penetrating a bottom surface of said shell body for coupling with said disk member so that said shell body is capable of rotation with respect to said protective casing; and
   a storing arrangement having a first end portion and a second end portion, wherein an electronic terminal is provided at a top surface of said first end portion, a coupling slot is transversely extended at a bottom surface of said second end portion, wherein said second end portion of said storing arrangement has access to said receiving cavity by passing through said insertion hole, and said coupling slot of said second end portion is coupled with said protrusion member so that said second end portion thereof is secured within said receiving cavity, such that when said shell body is rotated with respect to said protective casing to said retracting position, said partial protrusion member is moves straightly in said coupling slot to direct said first end portion of said storing arrangement to retract into said receiving cavity, wherein when said shell body rotates with respect to said protective casing to said application position, said partial protrusion member moving straightly in said coupling slot so as to direct said first end portion of said storing arrangement to get out of said receiving cavity.

2. The storing apparatus, as recited in claim 1, wherein said storing arrangement comprises a supporting member and a main body, wherein a cross section of said supporting member is substantially U-shaped and said supporting member has a base board constructed to define a supporting cavity having an open top side, wherein a coupling slot is transversely extended at a distal end of the base board, said main body having an electronic terminal in accordance with said first end portion of said storing arrangement for electronically connecting to a USB connecting terminal.

3. The storing apparatus, as recited in claim 1, wherein said coupling slot is provided at a partial position of said second end portion of said storing arrangement.

4. The storing apparatus, as recited in claim 2, wherein said coupling slot is provided at a partial position of said second end portion of said storing arrangement.

5. The storing apparatus, as recited in claim 1, wherein said protrusion member is adjacent to said open side at said partial position of said disk member.

6. The storing apparatus, as recited in claim 2, wherein said protrusion member is adjacent to said open side at said partial position of said disk member.

7. The storing apparatus, as recited in claim 3, wherein said protrusion member is adjacent to said open side at said partial position of said disk member.

8. The storing apparatus, as recited in claim 4, wherein said protrusion member is adjacent to said open side at said partial position of said disk member.

\* \* \* \* \*